United States Patent
Choi et al.

(10) Patent No.: US 7,012,031 B2
(45) Date of Patent: Mar. 14, 2006

(54) PHOTORESIST PATTERN, METHOD OF FABRICATING THE SAME, AND METHOD OF ASSURING THE QUALITY THEREOF

(75) Inventors: Yeon-Dong Choi, Ansan-si (KR); Kyoung-Yun Baek, Anyang-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 11/026,100

(22) Filed: Jan. 3, 2005

(65) Prior Publication Data

US 2005/0153466 A1 Jul. 14, 2005

(30) Foreign Application Priority Data

Jan. 8, 2004 (KR) .................. 10-2004-0001145

(51) Int. Cl.
*H01L 21/027* (2006.01)

(52) U.S. Cl. ........................ 438/942; 438/14

(58) Field of Classification Search .......... 438/14, 438/942
See application file for complete search history.

(56) References Cited

U.S. PATENT DOCUMENTS

| | | | |
|---|---|---|---|
| 5,468,595 A | 11/1995 | Livesay | |
| 6,485,895 B1 * | 11/2002 | Choi et al. | 430/330 |
| 6,489,085 B1 | 12/2002 | Huang et al. | |
| 6,703,328 B1 * | 3/2004 | Tanaka et al. | 438/462 |
| 6,780,781 B1 * | 8/2004 | Odaka et al. | 438/717 |
| 2002/0028405 A1 * | 3/2002 | Kim et al. | 430/270.1 |

\* cited by examiner

*Primary Examiner*—David Nelms
*Assistant Examiner*—Dao H. Nguyen
(74) *Attorney, Agent, or Firm*—Volentine Francos & Whitt, PLLC

(57) ABSTRACT

A photoresist pattern and a method of fabricating the same make it easy to quickly identify a particular portion of a photolithography process that is responsible for causing process defects. The method of fabricating the photoresist pattern includes forming main patterns having a predetermined critical dimension in device-forming regions of a semiconductor substrate, and forming a plurality of test patterns in scribe regions of the substrate. The scribe regions are defined alongside the device-forming regions and separate the device-forming regions from one another. The test patterns have shapes similar to that of the main patterns. Also, one of the test patterns has a critical dimensions similar to that of the main patterns, and other test patterns have respective critical dimensions that are different from the critical dimension of the main patterns.

16 Claims, 6 Drawing Sheets

PHOTORESIST PATTERN, METHOD OF FABRICATING THE SAME, AND METHOD OF ASSURING THE QUALITY THEREOF

BACKGROUND OF THE INVENTION

1. Field of the Invention

The present invention relates to a method of fabricating semiconductor devices. More particularly, the present invention relates to a photolithographic process of fabricating a photoresist pattern, and to the quality control of such a process.

2. Description of the Related Art

Semiconductor devices are dramatically evolving in conjunction with rapid developments in the fields of data communications and data processing. In these fields, especially, semiconductor devices must operate at high speeds and at the same time to have a large storage capacity. In response to these requirements, techniques of fabricating semiconductor devices are being studied and developed with the aim of maximizing the integration, reliability, response speed, etc., of the devices.

The fabricating of semiconductor devices typically includes a deposition process of forming a target film on a semiconductor substrate, a photolithography process of forming and patterning a photoresist layer on the target film, an etching process of selectively removing the portions of the target film exposed by the photoresist pattern, and a cleaning process of removing the photoresist pattern and the residue resulting from the etching process using a cleaning solution so that only the portion of the target film which was not removed by the etching process is left. The photolithography process entails directing exposure light onto the photoresist layer through a mask or reticle (hereinafter "photomask") having a pattern that is thereby transcribed onto the photoresist layer, and developing the exposed photoresist layer. As a result, selective portions of the photoresist layer are removed and the remaining portions constitute the photoresist pattern. The critical dimension of the photoresist pattern is dependent upon the energy level of the exposure light emitted onto the photoresist layer through the photomask.

However, as semiconductor devices become more highly integrated, the design rules of the devices become smaller and smaller, i.e., patterns having very small critical dimensions (CD) must be formed. These patterns often include a series of contact holes or a series of lines and spaces. Several techniques have been suggested for improving the photolithography process so that a fine pattern can be formed, e.g., a pattern comprising contact holes having small diameters or a pattern comprising lines and spaces having small widths.

Known photolithographic techniques for forming fine contact holes include the use of an E-beam having a short wavelength to expose the photoresist, and the use of a half-tone phase shift mask as the photomask. Of these techniques, the use of exposure light having a short wavelength poses a number of difficulties in terms of its dependence on photoresist having certain compositions and in terms of its high cost. The use of a half-tone phase shift mask is problematic in that it is difficult to fabricate such a mask in the first place. Also, it is actually difficult to form lines or contact holes having a CD less than 150 nm using a half-tone phase shift mask because of the phenomena of interference or diffraction that occurs during the exposure process.

Furthermore, another conventional technique comprises reflowing the photoresist pattern to thereby reduce the size of openings in the photoresist pattern (used for forming contact holes in the target layer) or to reduce the width of the spaces in photoresist pattern (used for forming lines in the target layer). In this technique, a photoresist film is formed on a wafer, the film Is patterned by a lithography process, and the resultant photoresist pattern is heated to a temperature higher than a so-called glass transfer temperature or the temperature at which the photoresist softens. As a result, the photoresist begins to reflow such that the critical dimension (CD) of the photoresist pattern is reduced.

A method of fabricating such a photoresist pattern is disclosed in U.S. Pat. No. 6,444,410, and the composition of a photoresist used for the fabrication of such a photoresist pattern is disclosed in U.S. Pat. No. 6,485,895.

Hereinafter, a prior art method of fabricating a photoresist pattern will be described with reference to the flowchart of FIG. 1. As shown in FIG. 1, a target layer, in which a main pattern is to be formed (such as a pattern of lines or contact holes), is first coated with photoresist (S101). The target layer may be a semiconductor substrate or a layer of material formed on the semiconductor substrate. The substrate is also subjected to a first annealing (i.e., a soft bake) so that a solvent component of the photoresist is removed from the photoresist layer formed on the substrate (S102).

The photoresist is then exposed to light of a certain wavelength via a photomask bearing a pattern corresponding to the main pattern (S103). Following the exposure process, a second annealing (i.e., a post exposure bake) is performed to minimize the amount of solvent remaining in the photoresist (S104).

The semiconductor substrate having the photoresist film formed thereon is then immersed in a developer solution. At this time, either the exposed portion of the photoresist is removed by the developer solution (positive type of photoresist) or the non-exposed portion is removed by the developer solution (negative type of photoresist) (S105). Accordingly, the photoresist is patterned. The photoresist pattern will serve as an etch mask for the formation of lines or contact holes in a portion of the underlying (target) layer located in a device-forming region of the semiconductor substrate. In the case of forming devices, such as transistors, the lines will electrically connect the devices, and the contact holes will extend through an interlayer insulating film formed on the semiconductor substrate to electrically connect devices or lines on opposite sides of the interlayer insulating film. The resultant product may be cleaned at this time.

Subsequently, the photoresist pattern is subjected to a third annealing (i.e., a hard bake) so that the photoresist pattern is stabilized after the developing or cleaning process (S106). Note, the first to third annealings are performed at the glass transfer temperature of the photoresist to evaporate the solvent contained in the photoresist and solidify the photoresist layer.

At this time, the critical dimension (CD) of the openings (holes or spaces) of the photoresist pattern is no smaller than the wavelength of the light that was used to expose the photoresist. Therefore, a fourth annealing (a photoresist reflow process) is performed for a predetermined time at a temperature higher than the glass transfer temperature of the photoresist to improve the profile of the photoresist pattern and to reduce the critical dimension (CD) of the openings of photoresist pattern (S107).

Furthermore, an after develop inspection (ADI) is conducted to confirm whether the critical dimension of the photoresist pattern, which is established after the third annealing, is within certain design parameters. Also, an after flow inspection (AFI) is conducted (S108) to confirm whether the reduced critical dimension, i.e., the critical dimension of the openings of the photoresist pattern after the fourth annealing, is within certain design parameters. The ADI and AFI are conducted using scanning electron spectroscopy. For reasons of productivity and economics, the after develop inspection of products is performed only if the after flow inspection uncovers a defect in a photoresist pattern.

More specifically, a number of semiconductor substrates received in a cassette, namely, one lot of substrates, are processed at a time by photolithography equipment, semiconductor fabrication equipment, and the like. For example, when a semiconductor device having transistors comprising a plurality of gate stacks are to be fabricated, contact holes must be formed in an interlayer insulating film of the device to expose the source/drain electrodes of the transistors. In this case, twenty-five semiconductor substrates are loaded in a cassette and the twenty-five semiconductor substrates are then subjected in sequence to a photolithography process to form photoresist patterns, on the substrates, respectively. The photoresist patterns correspond to the pattern of contact holes to be formed in the interlayer insulating film. Subsequently, i.e., when the photolithography process is completed with respect to the twenty-five semiconductor substrates, the cassette containing the twenty-five semiconductor substrates is transported to etching equipment. In the etching equipment, each of the semiconductor substrates is subjected to an etching process using the photoresist pattern as an etching mask. At this time, one semiconductor substrate is randomly selected from the lot, and is subjected to the after flow inspection. The after flow inspection is used to determine whether the photolithography process performed on the lot is defective (SI 08).

If the after flow inspection reveals that the photolithography process performed on the relevant lot is defective, a test process 11 is carried out. The test process 11 corresponds to the original fabrication process up through the third annealing. The test process 11 is for producing a substrate that will be subjected to an after develop inspection.

The test process II will be described in detail. If any lot does not pass the after flow inspection, a semiconductor substrate is selected from the lot after the lot is cleaned or a semiconductor substrate is selected from another lot which has not yet been subjected to the photolithography process. The selected substrate is subsequently coated with the photoresist (S111). Then, the photoresist formed on the semiconductor substrate is subjected to a first annealing so that solvent contained in the photoresist is removed (S112). Subsequently, the photoresist is selectively exposed to light of a certain wavelength through a photomask bearing an image of the main pattern (S113). After the exposure process is performed, a second annealing (i.e., a post expose bake) is performed to further reduce the amount of solvent in the photoresist (S114).

The semiconductor substrate having the photoresist formed thereon is immersed and developed in a developer solution (S115), whereby the layer of photoresist is patterned. The photoresist pattern is subjected to a third annealing (i.e., a hard bake) so that the photoresist pattern is solidified and stabilized (S116). Finally, the photoresist pattern formed on the semiconductor substrate is inspected (S117). If the photoresist pattern has a critical dimension that matches that of the pattern borne by the photomask used in the exposure process, the application temperature or time of the fourth annealing is regarded as being improper. At this time, the process temperature or time of the fourth annealing is tested, modified, and then applied in the mass-production process. On the other hand, if the critical dimension of the photoresist pattern does not match that of the photomask, the after develop inspection confirms that the process defect occurs prior to the fourth annealing. The exact cause of the process defect is then uncovered. To this end, the exposure process and the first to third annealing processes are sequentially inspected one by one.

Thus, the method of fabricating a photoresist pattern according to the prior art makes it is possible to recognize whether defects are associated with the fourth annealing. However, the method of fabricating the photoresist pattern according to the prior art presents the following problems.

First, if the after flow inspection reveals that the process defect is associated with the photolithography process, the after develop inspection is conducted on a semiconductor substrate selected from a lot which has not yet been subjected to the photolithography process, or the like. To this end, the photolithography process through the third annealing must be performed on the selected substrate using the available the photolithography equipment. This delays the production time, namely delays the photolithography process of the next lot. Accordingly, the overall productivity of the semiconductor device fabrication process is negatively impacted.

Secondly, some defects that can only be uncovered after the fourth annealing are due to minor discrepancies in the chemical composition of the photoresist or due to foreign material introduced from raw material used in the fabrication process or as a result of the transportation of the substrates through the semiconductor device fabrication equipment. In these case, the after flow inspection reveals the presence of such defects. Thus, the after develop inspection must be performed to recognize the exact cause of the defects. Also, tests must be performed to determine and modify the temperature or time of the fourth annealing. Such extensive testing is time-consuming and again, decreases the overall productivity that can be achieved in the semiconductor device manufacturing process.

SUMMARY OF THE INVENTION

An object of the present invention is to overcome the aforementioned problems and disadvantages of the prior art.

It is thus an object of the present invention to provide a photoresist pattern and a method of fabricating the same, by which a particular portion of a photolithography process that is responsible for causing process defects can be quickly identified according to information obtained in an after flow inspection process.

According to an aspect of the present invention, there is provided a photoresist pattern and a method of fabricating a photoresist pattern that includes main patterns and test patterns. The main patterns are formed over device-forming regions of the semiconductor substrate. The test patterns are formed n scribe regions, which form divisions among the device-forming regions. The plurality of test patterns have a shape similar to that of the main patterns. One of the test patterns has a critical dimension similar to that of the main patterns, while others of the test patterns have critical dimensions different from that of the main patterns.

Then, the substrate is annealed at a temperature above the glass transfer temperature of the photoresist to cause the photoresist to flow and thereby reduce the critical dimension of the main patterns. At the same time, the critical dimensions of the test patterns are reduced.

According to still another aspect of the present invention, there is provided a quality control method in which an after flow inspection is carried out on the photoresist pattern once the critical dimension of the main patterns has been reduced. This may be applied to a batch method in which one of the semiconductor substrates is selected from the batch after the photolithography process has been carried out. The after flow inspection involves determining the reduced critical dimension of the openings defined by the main patterns formed on the selected semiconductor substrate.

If the reduced critical dimension of the openings defined by the at least one main pattern is outside a design value, then the reduced critical dimensions of the openings defined by the test patterns formed on the selected semiconductor substrate are measured. Then, the slope of a plot of the values of the measured reduced critical dimensions is calculated, and the slope is compared to a predetermined value within a range of design tolerances. If the slope differs from the predetermined value by an amount greater than the range of tolerances, then an error is assigned to a portion of the photolithography process preceding that in which the photoresist was caused to flow.

BRIEF DESCRIPTION OF THE DRAWINGS

The foregoing and other objects, features and advantages of the invention will be apparent from the detailed description thereof that follows with reference to the accompanying drawing. Note, the drawings are not necessarily to scale, emphasis instead being placed upon illustrating the principles of the invention. Also, like reference characters are used to designate like elements throughout the drawings.

DETAILED DESCRIPTION OF THE PREFERRED EMBODIMENTS

The present invention will be described in more detail hereinafter with reference to the accompanying drawings.

Figure 1:
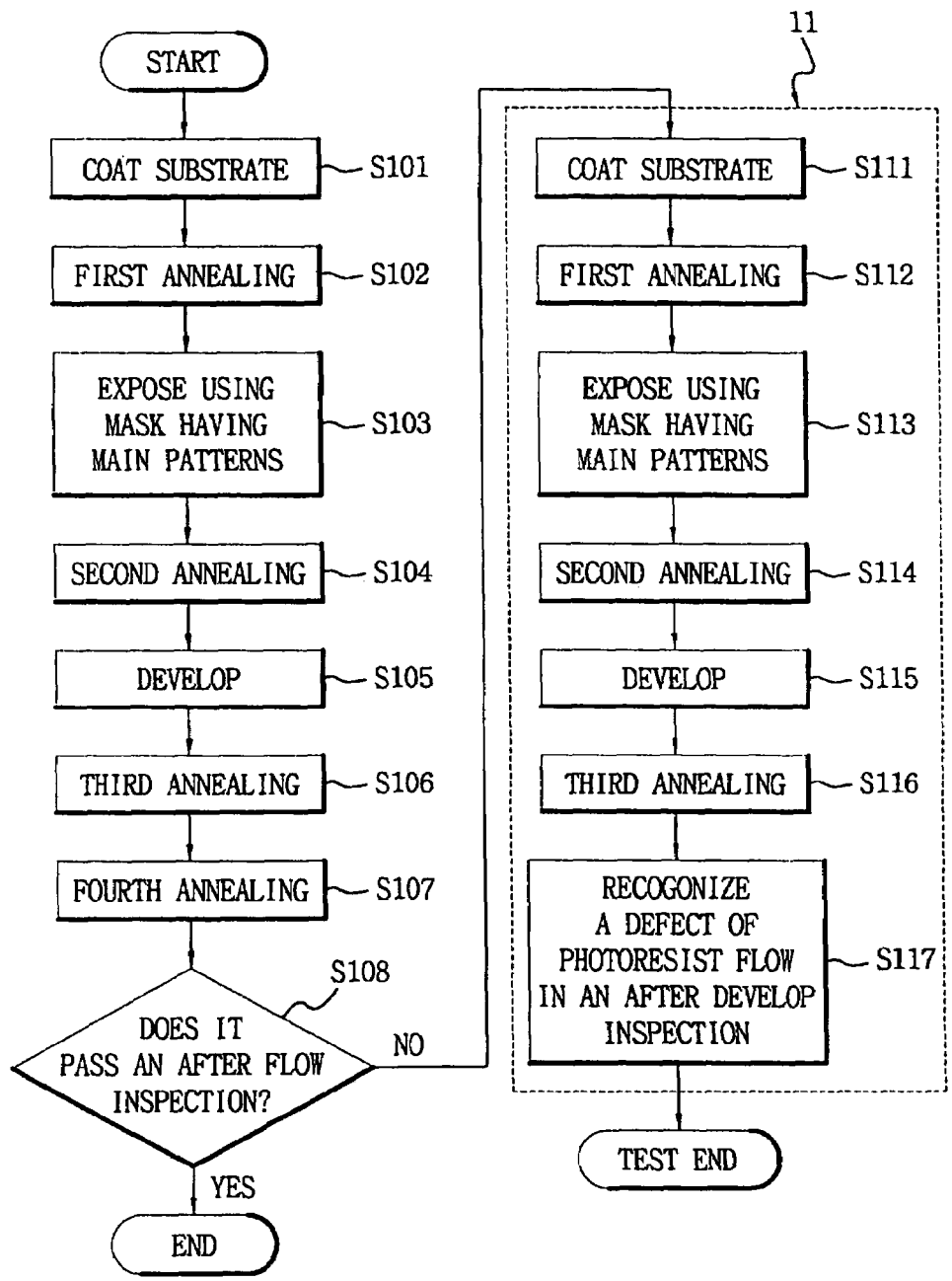
FIG. 1 is a flow chart of a method of fabricating a photoresist pattern according to the prior art.
Figure 2A:
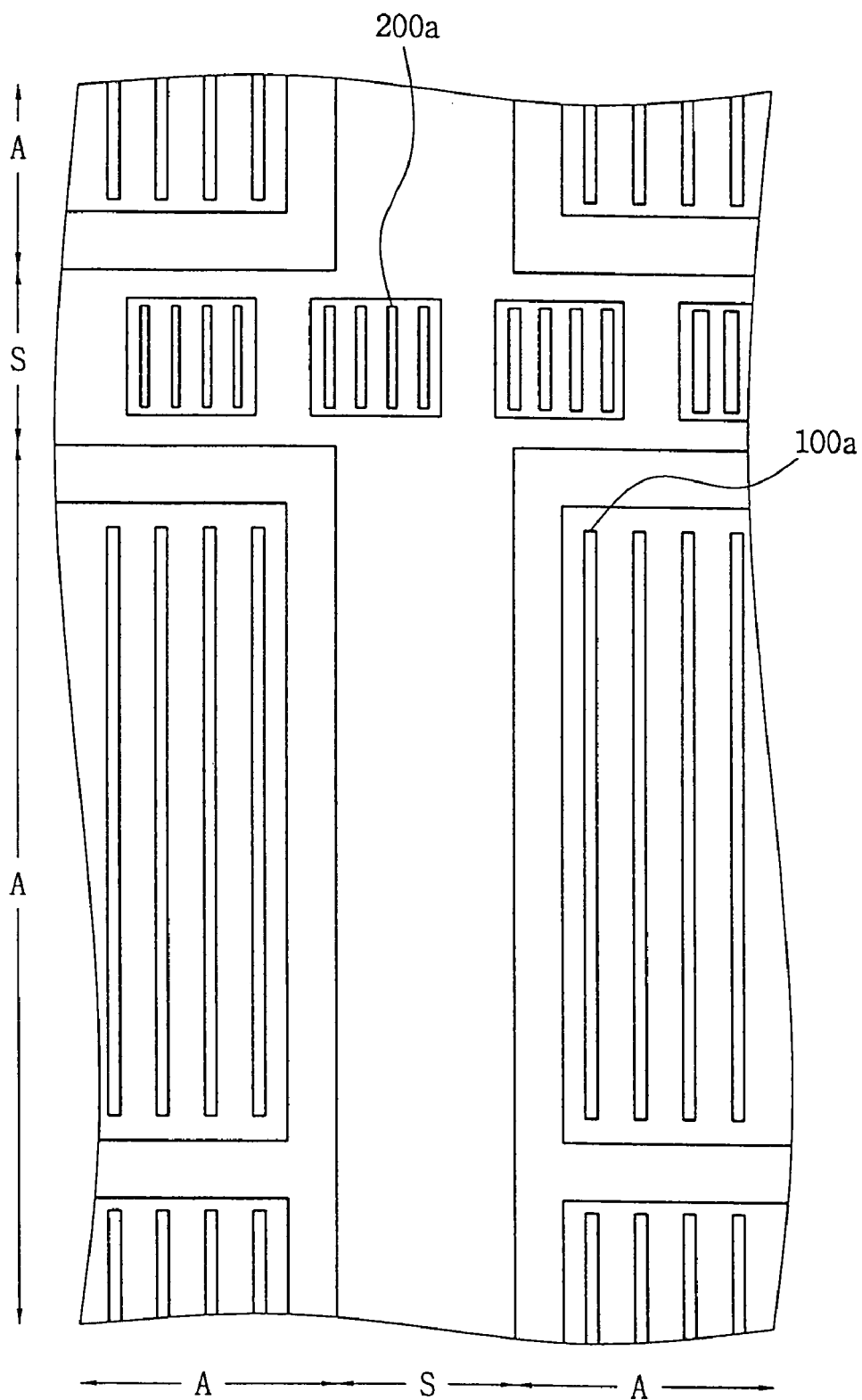
FIGS. 2a and 2b are each a plan view of part of a respective photoresist pattern according to the present invention.
Figure 2B:
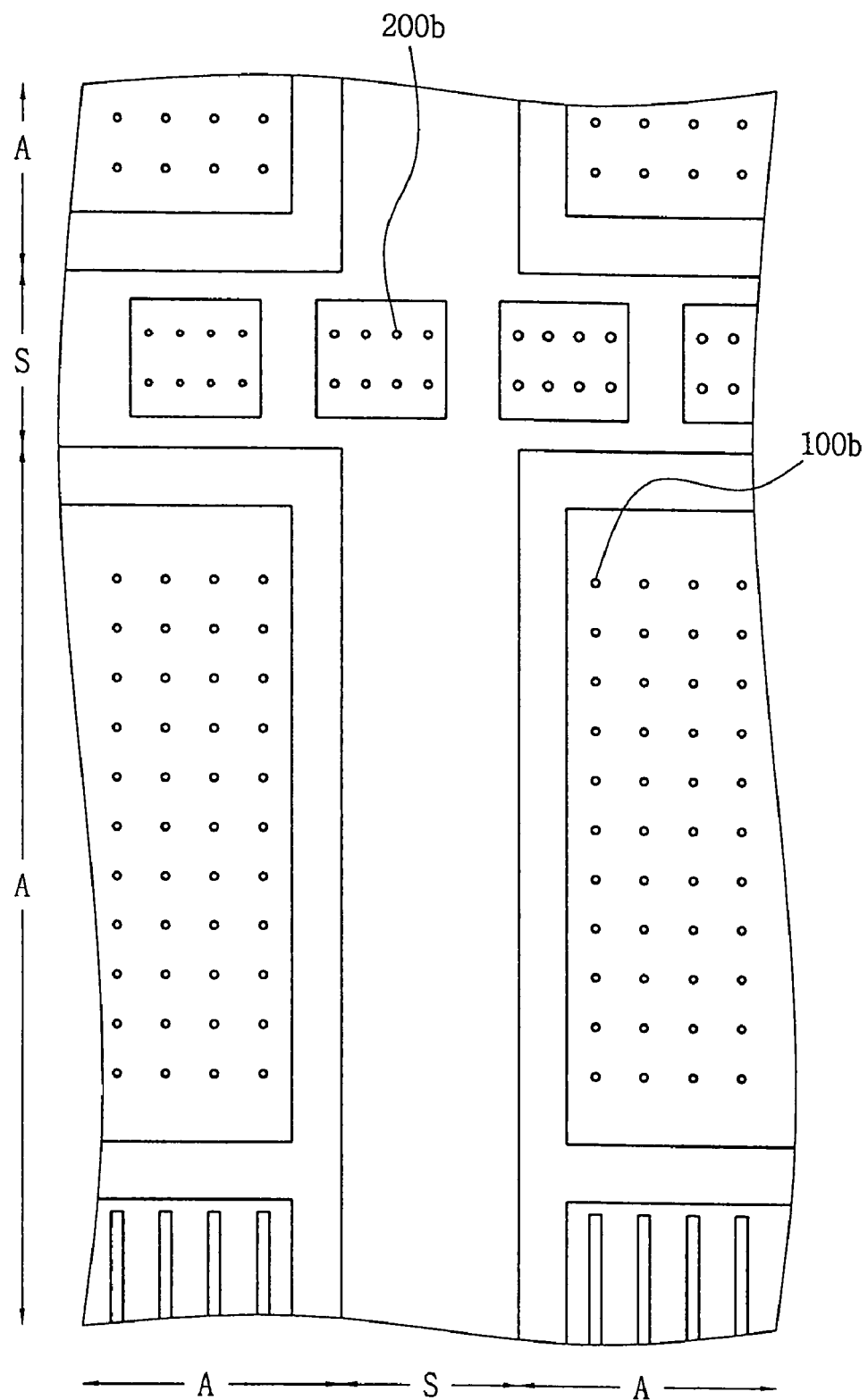

A photoresist pattern of the present invention, as shown in FIG. 2a or 2b, includes main patterns 100a or 100b in device-forming regions A defined on a semiconductor substrate, and a plurality of test patterns 200a or 200b in scribe regions S, wherein the scribe regions S separate the device-forming regions A from one another. The main patterns 100a or 100b have a given critical dimension. The openings of the test patterns 200a or 200b have shapes identical to those of the main patterns 100a and 100b and have critical dimensions different from each other. As will be described below, the test patterns 200a or 200b are dedicated for use in determining whether a defect had occurred in reflowing the photoresist to form the main patterns 100a or 100b.

The main patterns may be in the form of patterns 100a of lines and spaces (FIG. 2a) for use in forming lines in a metal layer, which lines will electrically connect various devices such as transistors formed on the semiconductor substrate.

The main patterns may also be in the form of patterns 100b of holes (FIG. 2b) for use in forming contact holes in an interlayer insulating film formed on a semiconductor substrate. As is known, per se, the contact holes will be filled with conductive material for electrically connecting lines and/or devices via the interlayer insulating film.

Furthermore, the device-forming regions A in which the main patterns 100a or 100b are formed are also known as chip regions that will contain the devices of respective chips, respectively. Each chip region includes a plurality of cell regions and peripheral regions. Thus, the pattern of each device-forming region A may constitute a minimal unit for the design of the pattern of the reticle or mask of the exposure device, such as a stepper or scanner, used for forming the photoresist pattern. The semiconductor substrate is cut along the scribe regions S after the semiconductor substrate has been processed to thereby separate the chips from one another.

As alluded to earlier, the test patterns 200a or 200b in the scribe regions S are dedicated for use in determining whether a defect has occurred in the process of reflowing the photoresist to finalize the main patterns 100a and 100b. In addition to the test patterns 200a or 200b, various test element groups (TEGS) or portions thereof are also formed in the scribe regions S. The TEGs are for use in electrically testing the various devices eventually formed in the device-forming regions A. For example, one device-forming region A may eventually have four cell regions (i.e., four banks). Various auxiliary devices, such as transistors, diodes or resistors are formed in the TEG portions of the scribe regions S outside the device-forming region A. These auxiliary devices are electrically connected to the devices in the cell regions via dedicated lines so the devices in the cell regions can be tested. The test patterns 200a or 200b may be provided in the TEG portions of the scribe regions S or outside the TEG portions of the scribe regions S.

Figure 3:
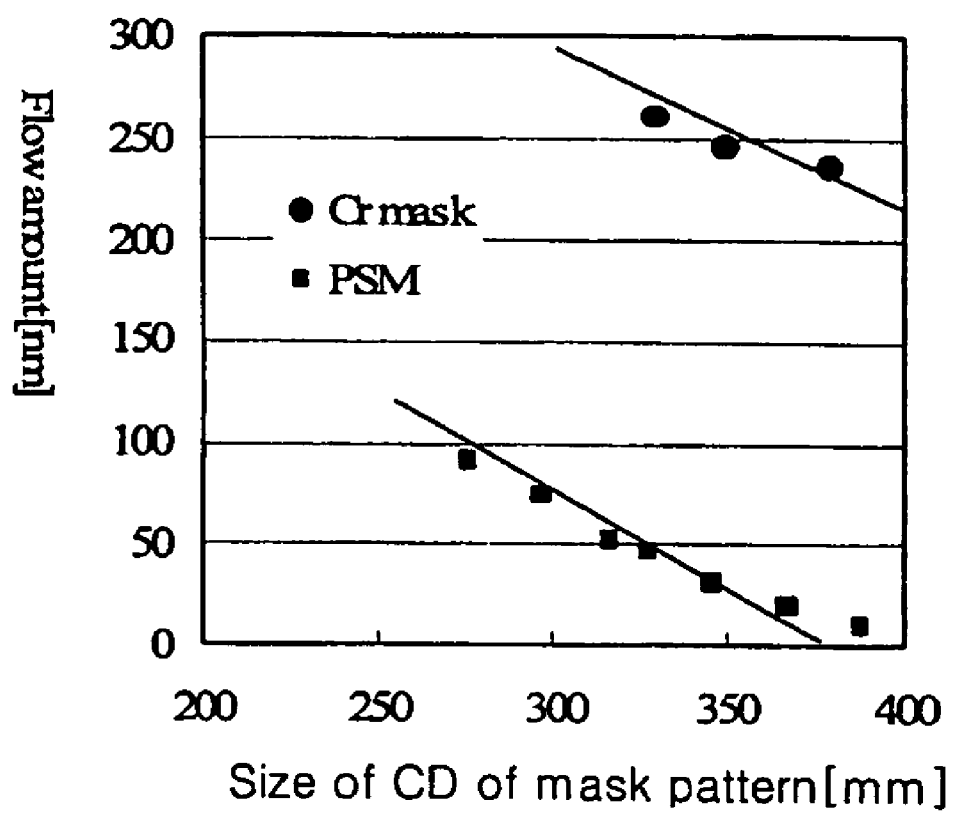
FIG. 3 is a graph illustrating changes in a photoresist pattern according to the size of the opening in the pattern of a photomask used to form the photoresist pattern according to the present invention.

FIG. 3 is a graph illustrating changes (flow amount) in a photoresist pattern upon being subjected to a given annealing, according to the size of the opening of the pattern of a photomask (a chromium binary mask or a phase shift mask) used to form the photoresist pattern. The annealing comprised heating a semiconductor substrate, having the photoresist pattern formed thereon, to a temperature of about 159° C. for about 90 seconds.

It can be seen that the amount of flow of the photoresist is inversely proportional to the size of the opening in the photomask and hence, to the critical dimension of the opening of the photoresist pattern. According to the present invention, the test patterns 200a of 200b of the photoresist pattern allow the flow of the photoresist due to annealing to be measured because the openings of the test patterns 200a or 200b have different critical dimensions. Thus, it is possible to confirm whether a defect in the finalized photoresist was the result of the annealing that was performed to cause the photoresist pattern to flow.

Figure 4A:
FIGS. 4a and 4b are plan views of test patterns of photomasks, respectively, used to form photoresist patterns according to the present invention.
Figure 4B:
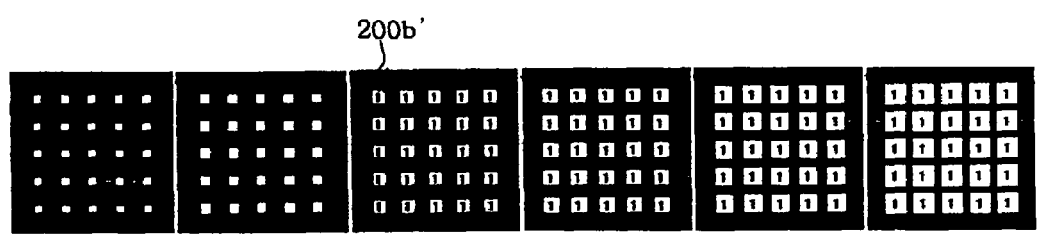

FIGS. 4a and 4b show test patterns 200a' and 200b' of a mask or reticle (photomask) used to form corresponding test patterns 200a or 200b in a layer of photoresist. The test patterns 200a' according to the present invention may comprise a number of spaces 1. The line widths of the spaces are the same as each other within each test pattern 200a' but are different from each other from test pattern 200a' to test pattern 200a'. Test patterns 200b' according to the present invention may comprise a number of dots. The dots have the same dimensions within each of test pattern 200b' but the dimensions of the dots differ from each other from test pattern 200b' to test pattern 200b'.

As is clear from the figures and the description above, each test pattern 200a' or 200b' includes at least one space 1 or dot 1 of the same size. Also, the respective test patterns 200a' or 200b', having lines or dots of different sizes, are arranged in sequence. For example, as shown in FIGS. 4a and 4b, the test patterns 200a' or 200b' are arranged in sequence along a line in the widthwise direction of the lines or in the direction of one dimension of the dots. Alternatively, the test patterns 200a' or 200b' may be arranged along a line in the lengthwise direction of the lines or in the direction of another dimension of the dots, may be arranged along two lines that cross each other, or may be arranged diagonally in the form of a step. Still further, the test patterns 200a' preferably each have the same number of spaces 1 within a given area (likewise, the test patterns 200b' preferably each have the same number of dots 200b' within a given area). Moreover, the spacing of the lines or dots within each test pattern is preferably the same or a multiple of the distance between the lines or holes of the main patterns.

Furthermore, the spaces 1 of the test patterns 200a' are rectangular. The widths of the spaces 1 range from a width that is smaller than the line width of the openings (spaces) of the main pattern 100a to a width that is larger than the line width. The lengths of the spaces 1 are the same, and are much larger than the widths of the spaces. The dots of the test patterns 200b' are square. The lengths of the sides of the dots range from range from lengths that are smaller than the diameters of the openings of the main pattern 100b to lengths that are larger than diameters. Note, when the test patterns 200b' having the square dots are used to pattern the photoresist, the resultant openings of the test patterns 200b become round due to interference or diffraction at the edges of the square dots.

Figure 5:
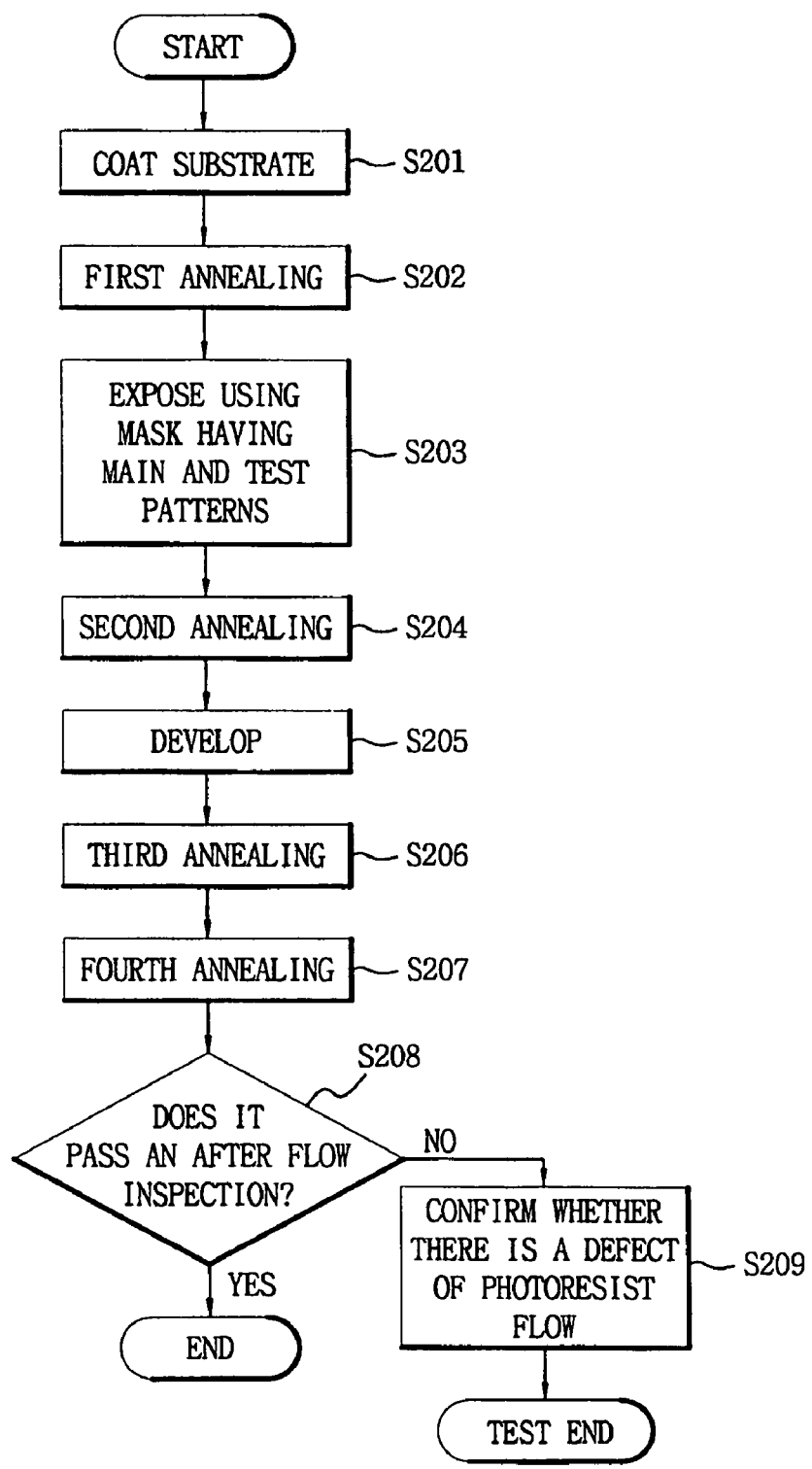
FIG. 5 is a flow chart of a method of fabricating a photoresist pattern according to the present invention.

A method of patterning a photoresist using a photomask having the test patterns 200a' or 200b' will now be described with reference to the flowchart of FIG. 5.

A semiconductor substrate on which a desired pattern is to be formed, or a layer of material formed on the semiconductor substrate, is coated with photoresist (S201). Preferably, the photoresist is applied by spin coating. For example, photoresist of a type known in the field as SE 146 is dispensed onto a target layer, and the semiconductor substrate is rotated at about 4000 rpm to about 4500 rpm for about 25 seconds. As a result, the target layer is coated with a 0.36 μm thick layer of the SE 146 photoresist.

Next, the photoresist film formed on the semiconductor substrate is subjected to a first annealing (e.g., a soft bake) so that solvent contained in the photoresist is removed (S202). For example, in the first annealing, the substrate is inserted into a furnace or oven and is heated at about 110° C. for about 90 seconds so that solvent evaporates from the photoresist.

Next, the photoresist film is selectively exposed using an exposure device, such as a stepper or a scanner. In particular, the photoresist film is irradiated with exposure light of a certain wavelength (light from a KrF or ArF light source) passed through a photomask having main patterns (corresponding to main patterns 100a or 100b) and test patterns 200a' or 200b' (corresponding to test patterns 200a or 200b) (S203). At this time, the main patterns are transcribed onto regions of the photoresist film corresponding to the device-forming regions A of the substrate, and the test patterns 200a' or 200b' are transcribed onto regions of the photoresist film corresponding to the scribe regions S of the substrate.

After the exposure process is performed, a second annealing (e.g., a post exposure bake) is performed to minimize the solvent remaining in the photoresist (S204). For example, in the second annealing, the substrate is inserted into a furnace or oven and is heated at about 100° C. for about 90 seconds.

The semiconductor substrate having the photoresist film formed thereon is then immersed into and developed by a developer solution (S205). At this time, the exposed portion of the photoresist film is removed in the developer solution (in the case of a positive type of photoresist), or the non-exposed portion is removed in the developer solution (in the case of a negative type of photoresist). As a result, the main patterns 100a or 100b, and the test patterns 200a or 200b are formed in the photoresist film.

Subsequently, the semiconductor substrate having the photoresist pattern thereon may be subjected to a third annealing (e.g., a hard bake) so that the photoresist pattern is solidified and stabilized after the developing process or a subsequent cleaning process (S206). For example, the third annealing process is performed at about 100° C. to about 110° C. for 90 seconds. Thus, the first to third annealing processes are performed at a temperature less than the glass transfer temperature of the photoresist.

Finally, a fourth annealing (e.g., a flow process) is performed in which the photoresist is heated at a temperature higher than the glass transfer temperature for a predetermined period of time to improve the profile of the photoresist pattern and to reduce the critical dimension of the main patterns 100a or 100b (S207). For example, in the fourth annealing, the critical dimension of the openings of the main patterns 100a or 100b is reduced by heating the photoresist at about 159° C. for about 90 seconds. Of course, the critical dimension of the openings of the test patterns 200a or 200b also decreases.

Next, an after flow inspection is carried out to determine whether the critical dimension of the openings of the main patterns 100a or 100b are reduced by the photoresist flow by an amount within design parameters. If the critical dimension is not reduced to a certain value or is reduced beyond a certain value, the temperature or duration of the fourth annealing process could be improper. This can be confirmed by noting the critical dimensions of the test patterns 200a or 200b during the after flow inspection, and comparing the critical dimensions with known data. In particular, if the critical dimensions of the test patterns 200a or 200b do not vary linearly according to the slope of the plotted values shown in FIG. 3, then a defect in the fourth annealing process is confirmed (S209).

Thus, the present invention obviates the need to carry out a separate after development inspection when the after flow inspection reveals a defect in the main patterns 200a or 200b. Accordingly, the present invention is a particularly efficient tool in the mass production of semiconductor devices. An example of the application of the present invention to a mass production process will now be described in detail.

A number of semiconductor substrates received in a cassette, namely, one lot of substrates, are processed at a time by photolithography equipment, semiconductor fabrication equipment, and the like. The photolithography equipment performs a photolithography process in which main patterns 100a or 100b and test patterns 200a are 200b are formed in a photoresist film.

For example, when a semiconductor device having transistors comprising a plurality of gate stacks are to be fabricated, contact holes must be formed in an interlayer insulating film of the device to expose the source/drain electrodes of the transistors. In this case, twenty-five semiconductor substrates are loaded in a cassette and the twenty-five semiconductor substrates are then subjected in sequence to a photolithography process to form the main patterns 100b and the test patterns 200b on the substrates, respectively. Subsequently, i.e., when the photolithography process is completed with respect to the twenty-five semiconductor substrates, the cassette containing the twenty-five semiconductor substrates is transported to etching equipment.

At this time, one semiconductor substrate is randomly selected with from the lot and is subjected to the after flow inspection (S208). If the after flow inspection reveals that the critical dimension of the openings of the main pattern 100b is not within acceptable tolerances, the photolithography process is determined as being defective. However, according to the present invention, the after flow inspection can also discriminate whether the underlying cause of the defect resided in the conditions under which the fourth annealing was carried out, given the fact that the amount of photoresist flow is inversely proportional to the size of the opening. To this end, the critical dimensions of the openings of the contact hole test patterns 200b are measured (S209). Then, it is determined whether the critical dimensions of the openings of the test patterns 200b decrease in value at a given slope.

If the after flow inspection of the test patterns 200b reveals that the defect in the photolithography process occurs prior to the fourth annealing, the first to third annealing processes are sequentially inspected one by one and are analyzed. Once the exact cause of the defect is so uncovered, the photolithography process is modified to prevent or reduce such defects from occurring again. Also, using the test patterns 200a or 200b whose critical dimensions is/are larger than that of the main patterns 100a or 100b, it is possible to confirm whether the reticle or mask was misaligned during the exposure process. On the other hand, the test patterns 200a or 200b whose critical dimensions is/are smaller than that of the main patterns 100a or 100b are used to confirm whether the defect occurred due to the temperature, duration, etc. of the fourth annealing process.

In the method of fabricating a photoresist pattern according to the present invention, the after flow inspection not only reveals whether the photolithography process for producing the main patterns 100a or 100b is defective, but is also used to discriminate whether the defect in the process was the result of discrepancies in the chemical composition of the photoresist or foreign material in the photoresist, or whether defect occurred due to the duration or temperature of the fourth annealing. Accordingly, the inspection and identification of process defect can be performed relatively quickly according to the present invention. Thus, the efficiency of the overall manufacturing process is enhanced.

Finally, although the present invention has been described above in connection with the preferred embodiments thereof, the present invention is not so limited. Rather, changes to and modifications of the preferred embodiments will be apparent to those of ordinary skill in the art. Accordingly, the true spirit and scope of the invention is defined not by the detailed description above but by the following claims.

What is claimed is:

1. A method for fabricating a photoresist pattern, comprising:
    providing a semiconductor substrate;
    forming a film of photoresist on the semiconductor substrate;
    forming main patterns in the photoresist film over a plurality of device-forming regions of the semiconductor substrate, respectively, wherein each of said main patterns defines a series of openings in the photoresist film that expose a layer disposed beneath the film, said openings having a critical dimension, and the device-forming regions being dedicated to accommodate components of at least one semiconductor device; and
    forming a plurality of test patterns in the film along scribe regions of the semiconductor substrate, the scribe regions extending between the device-forming regions and separating the device-forming regions from one another, the plurality of test patterns each defining at least one opening having a shape similar to that of the openings defined by said main patterns, the at least one opening defined by one of said test patterns having a critical dimension similar to that of the openings defined by said main patterns, and the at least one opening defined by another of said test patterns having a critical dimension different from that of the openings defined by said main patterns.

2. The method according to claim 1, wherein the openings defined by the test patterns each have the shape of a space or a dot.

3. The method according to claim 1, wherein at least one of the test patterns defines a plurality of openings having the same critical dimension.

4. The method according to claim 1, wherein the test patterns are formed in TEG portions of the scribe regions.

5. A method of fabricating a photoresist pattern, comprising:
    providing a semiconductor substrate;
    forming a film of photoresist on the semiconductor substrate;
    forming main patterns in the photoresist film over each of a plurality of device-forming regions of the semiconductor substrate, respectively, wherein each said main pattern defines a series of openings in the photoresist film that expose a layer disposed beneath the film, said openings having a critical dimension, and the device-forming regions being dedicated to accommodate components of at least one semiconductor device;
    forming a plurality of test patterns in the film along scribe regions of the semiconductor substrate, the scribe regions extending between the device-forming regions and separating the device-forming regions from one another, the plurality of test patterns each defining at least one opening having a shape similar to that of the openings defined by said main patterns, the at least one opening defined by one of said test patterns having a critical dimension similar to that of the openings defined by said main patterns, and the at least one opening defined by another of said test patterns having a critical dimension different from that of the openings defined by said main patterns; and
    subsequently causing the photoresist to flow in order to reduce the critical dimension of the openings defined by the main patterns and the test patterns.

6. The method according to claim 5, wherein the forming of a film of photoresist on the semiconductor substrate comprises dispensing photoresist onto the semiconductor substrate, and rotating the semiconductor substrate at about 4015 rpm for about 25 seconds.

7. The method according to claim 5, wherein the forming of the main patterns and the test patterns comprise:
    first annealing the film of photoresist formed on the semiconductor substrate;
    subsequently selectively exposing the film of photoresist to exposure light passed through a photomask having a mask pattern similar to the main and test patterns;

subsequently annealing the exposed film of photoresist; and subsequently developing the film of photoresist so that the main and test patterns are formed on the semiconductor substrate.

8. The method according to claim 7, wherein the first annealing of the photoresist film comprises heating the photoresist at a temperature of about 110° C. for about 90 seconds.

9. The method according to claim 7, wherein the exposing of the film of photoresist comprises irradiating the film with light emitted from a KrF or ArF light source.

10. The method according to claim 7, wherein the annealing of the exposed film of photoresist comprises heating the photoresist at a temperature of about 100° C. for about 90 seconds.

11. The method according to claim 7, and further including:

annealing the developed film of photoresist before causing the photoresist to flow.

12. The method according to claim 11, wherein the annealing of the developed film of photoresist comprises heating the photoresist at a temperature of about 100° C. to about 120° C. for about 90 seconds.

13. A quality control method for use in manufacturing semiconductor devices, comprising:

providing a batch of semiconductor substrates;

subjecting the semiconductor substrates of said batch to a photolithography process, wherein the photolithography process comprises for each semiconductor substrate forming a film of photoresist on the semiconductor substrate, forming main patterns in the photoresist film over each of a plurality of device-forming regions of the semiconductor substrate, respectively, wherein each said main pattern defines a series of openings in the photoresist film that expose a layer disposed beneath the film, said openings having a critical dimension, and the device-forming regions being dedicated to accommodate components of at least one semiconductor device, forming a plurality of test patterns in the film along scribe regions of the semiconductor substrate, the scribe regions extending between the device-forming regions and separating the device-forming regions from one another, the plurality of test patterns each defining at least one opening having a shape similar to that of the openings defined by said main patterns, the at least one opening defined by one of said test patterns having a critical dimension similar to that of the openings defined by said main patterns, and the at least one opening defined by another of said test patterns having a critical dimension different from that of the openings defined by said main patterns, and subsequently causing the photoresist on each of the semiconductor substrates to flow in order to reduce the critical dimension of the openings defined by the main patterns and the test patterns; and subsequently selecting one of the semiconductor substrates from the batch; and performing an after flow inspection of the selected substrate, the after flow inspection comprising determining the reduced critical dimension of the openings defined by the main patterns formed on the selected semiconductor substrate.

14. The method according to claim 13, and further comprising determining the reduced critical dimensions of the openings defined by the test patterns formed on the selected semiconductor substrate if the reduced critical dimension of the openings defined by the at least one main pattern is outside a design value.

15. The method according to claim 14, and further comprising calculating the slope of a plot of the values of the measured reduced critical dimensions, and comparing the slope to a design value within a range of tolerances.

16. The method according to claim 15, wherein if the slope differs from said design value by an amount greater than the range of tolerances, assigning an error to a portion of the photolithography process preceding that in which the photoresist was caused to flow.

* * * * *